(12) United States Patent
Seo et al.

(10) Patent No.: US 7,550,093 B2
(45) Date of Patent: Jun. 23, 2009

(54) LIQUID-CRYSTALLINE POLYESTER AND SOLUTION COMPOSITION COMPRISING THE SAME

(75) Inventors: Jongchul Seo, Tsukuba (JP); Satoshi Okamoto, Tsukuba (JP); Seung-Shin Lee, Pyeongtaek-Si (KR)

(73) Assignee: Sumitomo Chemical Company, Limited, Tokyo (JP)

( * ) Notice: Subject to any disclaimer, the term of this patent is extended or adjusted under 35 U.S.C. 154(b) by 193 days.

(21) Appl. No.: 11/652,510

(22) Filed: Jan. 12, 2007

(65) Prior Publication Data

US 2007/0187643 A1     Aug. 16, 2007

(30) Foreign Application Priority Data

Feb. 7, 2006   (JP)   .............................. 2006-029321
Jul. 28, 2006  (JP)   .............................. 2006-205875

(51) Int. Cl.
  *C09K 19/00*   (2006.01)
  *C09K 19/06*   (2006.01)
  *C09K 19/52*   (2006.01)

(52) U.S. Cl. ................. 252/299.01; 430/20; 430/270.1; 428/1.1; 349/117; 252/299.6

(58) Field of Classification Search .................. 430/20, 430/270.1; 349/117; 252/299.01, 299.6; 428/1.1

See application file for complete search history.

(56) References Cited

U.S. PATENT DOCUMENTS

| 5,418,281 A | * | 5/1995 | Yung et al. .................. 524/602 |
| 7,022,807 B2 | | 4/2006 | Okamoto et al. |
| 2007/0092709 A1 | * | 4/2007 | Okamoto et al. ......... 428/297.4 |

* cited by examiner

*Primary Examiner*—Geraldina Visconti
(74) *Attorney, Agent, or Firm*—Foley & Lardner LLP

(57) ABSTRACT

A liquid-crystalline polyester for film having small linear expansibility and high flexibility is provided. The polyester may have structural units —O—Ar1-CO—, —NH—Ar2-X—, —CO—Ar3-CO— and —CO—Ar4-Z-Ar5-CO— wherein Ar1 represents 1,4-phenylene, 2,6-naphthylene or 4,4'-biphenylene, Ar2 represents 1,4-phenylene or 1,3-phenylene, X represents —O— or —NH—, Ar3 represents 1,4-phenylene, 1,3-phenylene or 2,6-naphthylene, Ar4 and Ar5 independently represent 1,4-phenylene, 2,6-naphthylene or 4,4'-biphenylene, and Z represents —O—, —SO$_2$— or —CO—, in which the amount of monomer (1) is 30-80% by mol, the amount of monomer (2) is 10-35% by mol, the total amount of monomers (3) and (4) is 10-35% by mol and the amount of monomer (4) is 1% by mol or larger.

11 Claims, 1 Drawing Sheet

LIQUID-CRYSTALLINE POLYESTER AND SOLUTION COMPOSITION COMPRISING THE SAME

BACKGROUND OF THE INVENTION

1. Field of the Invention

The present invention relates to a liquid-crystalline polyester and a solution composition containing the liquid-crystalline polyester. The present invention also relates to a film of the liquid-crystalline polyester and the like.

2. Description of the Related Art

Recently, with increasing requirements for light-weight, high-density and small-size electric and electronic parts in the market, the application of flexible printed wiring boards and the like are being enlarged (as, for example, in complex parts having wiring, cable, connecter or the like) because of its flexibility, large space freedom and availability in practical installment with sterically high density.

The flexible printed wiring board can be produced by laminating a metal foil onto an electrical-insulation base film and preparing a circuit. The base film having a high flexibility has been eagerly anticipated.

One of known base films is obtained, for example, by a method of applying a solution composition comprising an aprotic solvent and a liquid-crystalline polyester having a structural unit derived from aromatic amine onto a support and removing the solvent (see, JP-A-2004-315678, corresponding to U.S. Pat. No. 7,022,807). While the base film obtained by such a method has a high flexibility, it is demanded to provide a base film having not only high flexibility but also good dimensional stability.

In order to prepare a base film having a high dimensional stability, a method of adding fillers is also known. However, the base film containing fillers tends to have a lowered flexibility. In addition to the dimensional stability, it still has been desired to develop a film which is difficult to curl up (or having a small curling property) in a laminate with a conductive layer or in a flexible printed wiring board.

SUMMARY OF THE INVENTION

One of the objects of the present invention is to provide a liquid-crystalline polyester which can prepare a film having a high flexibility, a high dimensional stability and a small curling property. The present inventors have zealously investigated and consequently found a liquid-crystalline polyester with such properties.

The present invention provides a liquid-crystalline polyester obtainable by polymerizing monomers (1) to (4) which derive structural units represented by formulas (i) to (iv) respectively below:

—O—Ar1-CO—, (i)

—NH—Ar2-X—, (ii)

—CO—Ar3-CO— and (iii)

—CO—Ar4-Z-Ar5-CO—, (iv)

wherein Ar1 represents 1,4-phenylene, 2,6-naphthylene or 4,4'-biphenylene, Ar2 represents 1,4-phenylene or 1,3-phenylene, X represents —O— or —NH—, Ar3 represents 1,4-phenylene, 1,3-phenylene or 2,6-naphthylene, Ar4 and Ar5 independently represent 1,4-phenylene, 2,6-naphthylene or 4,4'-biphenylene, and Z represents —O—, —$SO_2$— or —CO—, in which the amount of monomer (1) is 30-80% by mol, the amount of monomer (2) is 10-35% by mol, the total amount of monomers (3) and (4) is 10-35% by mol and the amount of monomer (4) is 1% by mol or larger, the amounts of which are all on the molar basis of the total amount of monomers (1) to (4).

The present invention also provides a film containing the above-described liquid-crystalline polyester, and a method for producing the film.

Further, the present invention provides a solution composition comprising the liquid-crystalline polyester and a solvent.

Moreover, the present invention provides a laminate comprising the above-described film, a flexible printed wiring board having the laminate, and the like.

The film of the present invention has a small linear expansibility and is excellent in flexibility. Due to such properties, the laminate and the flexible printed wiring board, each comprising the film of the present invention, are excellent in flexibility and dimensional stability and are also difficult to curl up, desirably.

DETAILED DESCRIPTION OF THE PREFERRED EMBODIMENTS

Figure 1:
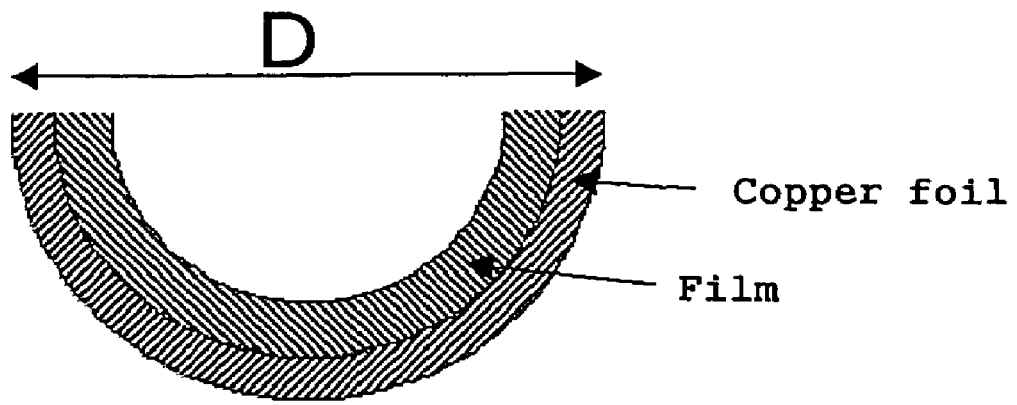
FIG. 1. is a view showing a frame format of a laminate having Curl Degree of 1 or smaller.

A liquid-crystalline polyester in the present invention is a polyester obtainable by polymerizing monomers (1) to (4) which derive structural units represented by formulas (i) to (iv) respectively below:

—O—Ar1-CO—, (i)

—NH—Ar2-X—, (ii)

—CO—Ar3-CO— and (iii)

—CO—Ar4-Z-Ar5-CO—, (iv)

wherein Ar1 represents 1,4-phenylene, 2,6-naphthylene or 4,4'-biphenylene, Ar2 represents 1,4-phenylene or 1,3-phenylene, X represents —O— or —NH—, Ar3 represents 1,4-phenylene, 1,3-phenylene or 2,6-naphthylene, Ar4 and Ar5 independently represent 1,4-phenylene, 2,6-naphthylene or 4,4-biphenylene, and Z represents —O—, —$SO_2$— or —CO—. The liquid-crystalline polyester comprises the structural units represented by formulas (i) to (iv). Preferably, the liquid-crystalline polyester essentially consists of the structural units represented by formulas (i) to (iv).

For the polymerization, monomer (1) is used in the amount of 30-80% by mol, and monomer (2) is used in the amount of 10-35% by mol. Monomers (3) and (4) are used so that the total amount of monomers (3) and (4) is 10-35% by mol, and the amount of monomer (4) is 1% by mol or larger. The above-mentioned amounts of monomers are all on the molar basis of the total amount of monomers (1) to (4).

In the present invention, the polymer obtained from the above-mentioned polymerization using monomers (1), (2) and the like is referred to as a "polyester", although the polymer has not only ester bonding but also an amide bonding (—CONH—) which results from monomer (2).

The structural unit represented by formula (i) may be a structural unit derived from an aromatic hydroxycarboxylic acid or a derivative thereof. Preferred monomer (1) is a monomer represented by formula (1a) below:

$$R^{10}-O-Ar1-CO-R^{11}, \quad (1a)$$

wherein Ar1 is the same as mentioned above, $R^{10}$ represents a hydrogen atom or an acyl group having carbon number of 1 to 8, $R^{11}$ represents a hydroxyl group, a halogen atom, an alkoxyl group having carbon number of 1 to 8 or an acyloxyl group having carbon number of 1 to 8.

Examples of the preferred monomer (1) include an aromatic hydroxycarboxylic acid selected from p-hydroxybenzoic acid, 2-hydroxy-6-naphthoic acid and 4'-hydroxybiphenyl-4-carboxylic acid. In view of improving polymerization properties, it is preferred to use as monomer (1) a monomer obtained by substituting a phenolic hydroxyl group of the aromatic hydroxycarboxylic acid with an acyl group; and a monomer obtained by substituting a carboxylic group of the aromatic hydroxycarboxylic acid with an acyl-halogen group, an ester group or acyloxycarbonyl group. The substituting of the phenolic hydroxyl group with the acyl group and the substituting of the carboxylic group with the acyloxycarbonyl group may be conducted by reacting the aromatic hydroxycarboxylic acid with carboxylic anhydride. The substituting of the carboxylic group with the acyl-halogen group or the ester group may be conducted by reacting the aromatic hydroxycarboxylic acid with an agent for halogenation (such as thionyl chloride, thionyl bromide and N-bromosuccinamide) or an alcohol. It is more preferred to use as monomer (1) a monomer obtained by reacting the aromatic hydroxycarboxylic acid with carboxylic anhydride (mentioned below), since such a monomer has good polymerization properties and easiness in handling.

As described above, monomer (1) may be used for preparing the polyester of the present invention in the amount of 30-80% by mol on the molar basis of the total amount of monomers (1) to (4). The amount of monomer (1) is preferably 35-65% by mol, and is more preferably 40-55% by mol. Such an amount (molar ratio) of monomer (1) is about the same as the molar polymerization ratio of the structural unit represented by formula (i) in the resulting polyester. When the molar polymerization ratio of the structural unit represented by formula (i) is less than 30% by mol, the resulting polyester may be difficult to have liquid crystallinity. On the other hand, when the molar polymerization ratio is more than 80% by mol, the resulting polyester may have a low solubility in a solvent in preparing a solution composition of the polyester described below.

The structural unit represented by formula (ii) may be a structural unit derived from an aromatic diamine or a derivative thereof (which corresponds to the case when X is —NH—); or a structural unit derived from an aromatic amine having a phenolic hydroxyl group or a derivative thereof (which corresponds to the case when X is —O—). Preferred monomer (2) is a monomer represented by formula (2a) below:

$$R^{20}-NH-Ar2-X-R^{21}, \quad (2a)$$

wherein Ar2 and X are the same as mentioned above, $R^{20}$ and $R^{21}$ independently represents a hydrogen atom or an acyl group having carbon number of 1 to 8.

Examples of the preferred monomer (2) include an aromatic diamine selected from 1,3-phenylenediamine and 1,4-phenylenediamine, an aromatic amine having a phenolic hydroxyl group selected from 3-aminophenol and 4-aminophenol, and a monomer obtained by reacting these aromatic diamine or aromatic amine with a carboxylic acid anhydride. In view of improving polymerization properties, it is preferred to use as monomer (2) a monomer obtained by the reaction of aromatic diamine and/or aromatic amine with the carboxylic acid anhydride.

As described above, monomer (2) may be used for preparing the polyester of the present invention in the amount of 10-35% by mol on the molar basis of the total amount of monomers (1) to (4). The amount of monomer (2) is preferably 17.5-32.5% by mol, and is more preferably 22.5-30% by mol. Such an amount (molar ratio) of monomer (2) is about the same as the molar polymerization ratio of the structural unit represented by formula (ii) in the resulting polyester. When the molar polymerization ratio of the structural unit represented by formula (ii) is less than 10% by mol, the resulting polyester may have a low solubility in a solvent in preparing a solution composition of the polyester described below. On the other hand, when the molar polymerization ratio is more than 35% by mol, the resulting polyester may be difficult to have liquid crystallinity.

The structural unit represented by formula (iii) may be a structural unit derived from an aromatic dicarboxylic acid or a derivative thereof. Preferred monomer (3) is a monomer represented by formula (3a) below:

$$R^{30}-CO-Ar3-CO-R^{31}, \quad (3a)$$

wherein Ar3 is the same as mentioned above, $R^{30}$ and $R^{31}$ independently represents a hydrogen atom, a halogen atom, an alkoxyl group having carbon number of 1 to 8 or an acyloxyl group having carbon number of 1 to 8.

Examples of the preferred monomer (3) include an aromatic dicarboxylic acid selected from terephthalic acid, isophthalic acid, phthalic acid and 2,6-naphthalene dicarboxylic acid. In view of improving polymerization properties, it is preferred to use as monomer (3) a monomer obtained by substituting a carboxylic group of the aromatic dicarboxylic acid with an acyl-halogen group, an ester group or acyloxycarbonyl group. The method for substituting the carboxylic group may be the same method described above regarding monomer (1). It is more preferred to use as monomer (3) a monomer obtained by reacting the aromatic dicarboxylic acid with carboxylic anhydride, since such a monomer has good polymerization properties and easiness in handling.

The structural unit represented by formula (iv) may be a structural unit derived from an aromatic dicarboxylic acid with Z group or a derivative thereof. Preferred monomer (4) is a monomer represented by formula (4a) below:

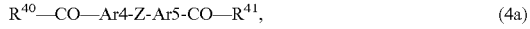
$$R^{40}-CO-Ar4-Z-Ar5-CO-R^{41}, \quad (4a)$$

wherein Ar4 and Ar5 are the same as mentioned above, $R^{40}$ and $R^{41}$ independently represents a hydrogen atom, a halogen atom, an alkoxyl group having carbon number of 1 to 8 or an acyloxyl group having carbon number of 1 to 8.

Examples of the preferred monomer (4) include an aromatic dicarboxylic acid selected from diphenylether-4,4'-dicarboxylic acid, diphenylsulfone-4,4'-dicarboxylic acid and benzophenone-4,4'-dicarboxylic acid. In view of improving polymerization properties, it is preferred to use as monomer (4) a monomer obtained by substituting a carboxylic group of the aromatic dicarboxylic acid with an acyl-halogen group, an ester group or acyloxycarbonyl group. The method for substituting the carboxylic group may be the same method described above regarding monomer (1). It is more preferred to use as monomer (4) a monomer obtained by reacting the aromatic dicarboxylic acid with carboxylic anhydride, since such a monomer has good polymerization properties and easiness in handling.

As described above, monomers (3) and (4) are used so that the total amount of monomers (3) and (4) is 10-35% by mol on the molar basis of the total amount of monomers (1) to (4). The total amount of monomers (3) and (4) is preferably 17.5-32.5% by mol, and is more preferably 22.5-30% by mol. Such a total amount (molar ratio) of monomers (3) and (4) is about the same as the molar polymerization ratio of the structural unit represented by formula (iii) and the structural unit represented by formula (iv) in the resulting polyester. Such a total amount relates to the liquid crystallinity and solubility in a solvent of the resulting polyester, as is mentioned above regarding monomer (2).

As described above, monomer (4) may be used for preparing the polyester of the present invention in the amount of 1% by mol or larger on the molar basis of the total amount of monomers (1) to (4). The amount of monomer (4) is preferably 10-30% by mol, and is more preferably 15-25% by mol. Such an amount (molar ratio) of monomer (4) is about the same as the molar polymerization ratio of the structural unit represented by formula (iv) in the resulting polyester.

In preparing the polyester of the present invention, it is not necessary to use monomer (3). In such a case, monomer (4) is used in the amount of 10-35% by mol on the molar basis of the total amount of monomers (1), (2) and (4).

The polymerization degree of the polyester can be controlled by adjusting the molar ratio of the amount of monomer (2) to the total amount of monomers (3) and (4). The molar ratio is calculated by dividing the amount of monomer (2) by the total amount of monomers (3) and (4) (i.e., [the amount of monomer (2)]/[the total amount of monomers (3) and (4)]). The ratio is preferably in the range of from 0.9 to 1.1. More preferably, monomer (2) is used in the equivalent amount (by mole) of the total amount of monomers (3) and (4).

The liquid-crystalline polyester in the present invention is a polyester which can be obtained by polymerizing monomers (1) to (4). For example, the polymerization may be conducted in the methods disclosed in JP-A-2002-220444, JP-A-2002-146003 and the like. Preferably, the liquid-crystalline polyester is obtained by the polymerization conducted after acylation of aromatic hydroxycarboxylic acid, aromatic diamine (and/or aromatic amine having a phenolic hydroxyl group) and aromatic dicarboxylic acid with carboxylic anhydride. By such an acylation, the polymerization properties of these monomers can be improved. Specifically, the polymerization can be carried out by mixing these monomers, then adding the carboxylic anhydride to conduct a pre-reaction and then polymerizing the acylated monomers in the same vessel as that for the pre-reaction.

More specifically, the liquid-crystalline polyester may be obtained by a method in which the phenolic hydroxyl groups and/or amino groups in the aromatic carboxylic acid, the aromatic amine having a phenolic hydroxyl group and the aromatic diamine are acylated with an excess amount of carboxylic anhydride to obtain acylated compounds (monomers) thereof, and the acylated compounds are subjected to melt-polymerization with the aromatic dicarboxylic acid to conduct transesterification and amide exchange (polycondensation).

In the acylation process, the amount of the carboxylic anhydride is preferably from 1.0 to 1.2 equivalents, more preferably from 1.05 to 1.1 equivalents, per one equivalent of the total amount of the phenolic hydroxyl group and amino group.

When the amount of the carboxylic anhydride is less than the above lower limit, the acylated compound and the raw monomers tend to sublime during the trans-esterification and/or amide exchange (polymerization) so that a reaction system may be clogged. When the amount of the carboxylic anhydride exceeds is the above upper limit, the liquid-crystalline polyester obtained tends to be noticeably colored.

The acylation is preferably carried out at a temperature of 130 to 180° C. for 5 minutes to 10 hours, more preferably at a temperature of 140 to 160° C. for 10 minutes to 3 hours.

The kind of the carboxylic anhydride used for acylation is not critical. Examples of the carboxylic anhydride include acetic anhydride, propionic anhydride, butyric anhydride, isobutyric anhydride, valeric anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, succinic anhydride, β-bromopropionic anhydride, etc. These anhydrides may be used independently or in admixture of two or more of them.

Among them, acetic anhydride, propionic anhydride, butyric anhydride and isobutylic anhydride are preferable from the viewpoint of their costs and handling properties. More preferably, acetic anhydride is used.

In the polymerization, the acylated compound is preferably used in such an amount that the equivalent of the acyl group is 0.8 to 1.2 times the equivalent of the carboxyl group.

The polymerization is preferably carried out in a temperature range between 130 and 400° C. while raising a temperature at a rate of 0.1 to 50° C./min., more preferably in a temperature range between 150 and 350° C. while raising a temperature at a rate of 0.3 to 5° C./min.

The unreacted carboxylic anhydride and by-produced carboxylic acids are preferably removed from the reaction system by, for example, evaporation to shift the equilibrium in reaction to the product side during the polymerization.

The acylation and/or the polymerization may be carried out in the presence of a catalyst. The catalyst may be a conventional catalyst which has been used as a polymerization catalyst for polyester. Examples of the catalyst include metal salt catalysts (e.g. magnesium acetate, stannous acetate, tetrabutyl titanate, lead acetate, sodium acetate, potassium acetate, antimony trioxide, etc.), organic compound catalysts such as a heterocyclic compound having two or more of nitrogen atoms (e.g. N,N-dimethylaminopyridine, N-methylimidazole, etc.) and so on.

Among them, a heterocyclic compound such as N,N-dimethylaminopyridine and N-methylimidazole can be preferably used (see, JP-A-2002-146003).

The catalyst may be added to a reactor when the monomers are charged in the reactor. The catalyst used in the acylation may not necessarily be removed, and the reaction mixture obtained by the acylation may be subjected to the polymerization.

The polymerization may be carried out by melt-polymerization, which may be followed by solid phase polymerization. When the solid phase polymerization is conducted, the polymer obtained from the melt-polymerization is preferably milled to obtain the powder-form or flake-form polymer and then it is subjected to the conventional solid phase polymerization. For example, in the solid-phase polymerization, the polymer obtained from the melt-polymerization is heated in an atmosphere of an inert gas such as nitrogen at a temperature of 20 to 350° C. for 1 to 30 hours.

The solid phase polymerization may be carried out with or without agitating the polymer. When a reactor is equipped with a suitable agitation mechanism, the melt-polymerization and the solid phase polymerization can be carried out in the same reactor. After the solid phase polymerization, the liquid-crystalline polyester obtained may be palletized in a conventional manner and then molded or shaped.

The liquid-crystalline polyester may be produced batchwise or continuously.

Thus, the liquid-crystalline polyester of the present invention can be obtained. The liquid-crystalline polyester can be molded (shaped) by well-known molding methods to provide molded articles such as film. The obtained film has high flexibility and dimensional stability. Using the film, a laminate comprising the film and a conductive layer is also provided in the present invention. The laminate does not curl so much.

In molding, filler, additive, thermoplastic resin and the like may be added to the polyester as long as such adding does not make adverse effects. Examples of the filler include organic fillers such as epoxy resin powder, melamine resin powder, urea-formaldehyde resin powder, benz guanamine resin powder and styrene resin; and inorganic fillers such as silica, alumina, titania, zirconia, kaolin, calcium carbonate, calcium dihydrogen phosphate, aluminum borate, potassium titanate, magnesiumsulfate, zincoxide, siliconcarbide, siliconnitride, glass fiber and alumina fiber. Examples of the additive include coupling agent, sedimentation inhibitor, ultraviolet absorber and heat stabilizer. Examples of the thermoplastic resins include polypropylene, polyamide, polyester, polyphenylene sulfide, polyether ketone, polycarbonate, polyether sulfone, polyphenyl ether and modification products thereof, polyether imides, and elastomer such as copolymers of etylene and glycidylmethacrylate.

The liquid-crystalline polyester of the present invention is excellent in solubility. Therefore, the polyester can be used in various kinds of usage as a solution composition thereof. The solution composition comprises the liquid-crystalline polyester of the present invention and a solvent, and may be produced as described below. The solvent is not limited as long as the liquid-crystalline polyester can be dissolved therein. Preferably, the solvent is a solvent comprising an aprotic solvent. More preferably, the solvent is a 100% aprotic solvent.

In the solution composition, the liquid-crystalline polyester may be contained in the amount of 0.01 to 100 parts by weight based on 100 parts by weight of the solvent (which may be a 100% aprotic solvent). When the concentration of the liquid-crystalline polyester is too low, the viscosity of the solution composition may become low, which may result in difficulty in uniform applying in applying the solution composition onto a substrate or the like; whereas when the concentration of the liquid-crystalline polyester is too high, the solution composition tends to have too high viscosity. From the viewpoint of applicability and economy, the liquid-crystalline polyester is contained preferably in the amount of 1 to 50 parts by weight, and more preferably in the amount of 2 to 10 parts by weight, based on 100 parts by weight of the solvent (which may be a 100% aprotic solvent).

Examples of the aprotic solvent include a halogen-based solvent such as 1-chlorobutane, chlorobenzene, 1,1-dichloroethane, 1,2-dichloroethane, chloroform and 1,1,2,2-tetrachloro ethane; an ether solvent such as diethyl ether, tetrahydrofuran and 1,4-dioxane; a ketone solvent such as acetone and cyclohexanone; an ester solvent such as ethyl acetate; a lactone solvent such as γ-butyrolactone; a carbonate-based solvent such as ethylene carbonate and propylene carbonate; an amine solvent such as triethylamine and pyridine; a nitrile solvent such as acetonitrile, succinonitrile; an amide solvent such as N,N-dimethylformamide, N,N-dimethylacetamide, tetramethylurea, 1-methyl-2-pyrrolidone; a nitro system solvent such as nitromethane and nitrobenzene; a sulfide solvent such as dimethylsulfoxide and sulfolane; and a phosphoric acid solvent such as hexamethylphosphoramide and tri-n-butyl phosphate.

Among these, the solvents which do not have halogen atom are preferred from the environmental point of view. From the viewpoint of solubility, the solvents preferably have a dipole moment of 3 to 5. Preferred solvents are an amide solvent such as such as N,N-dimethylformamide, N,N-dimethylacetamide, tetramethylurea, 1-methyl-2-pyrrolidone; and a lactone solvent such as γ-butyrolactone. More preferred solvents are N,N-dimethylformamide, N,N-dimethylacetamide and 1-methyl-2-pyrrolidone.

As described above, the solution composition of the present invention preferably contains an aprotic solvent, but can contain other solvents within the amount of not providing adverse effects.

The solution composition can be subjected to filtration through a filter, if necessary, so that fine foreign substances contained in the solution are removed.

If necessary, filler, additive, thermoplastic resin and the like may be added to the solution composition as long as such adding does not make adverse effects. Examples of the fillers, additive and thermoplastic are the same as those for the polyester as described above.

Using the solution composition, a film containing the liquid-crystalline polyester of the present invention can be produced in a simple method such as solution casting method.

The film may be produced, for example, by a method comprising the steps of applying (i.e., casting) the solution composition on a support, removing the solvent in the solution composition, heating the resulting support and removing the support. Examples of the method of applying the solution composition include roller coating method, dip coating method, spray coating method, curtain coating method, slot coating method, screen printing method and the like.

Methods for removing the solvent are not particularly limited and preferred method is evaporation of the solvent. Removal of the solvent may be carried out by heating, evaporating, ventilating or the like. Among them, evaporation with heating is preferred from the viewpoint of productivity and handling, and evaporation with heating and ventilation is more preferred. Evaporation is preferably conducted at a temperature of the boiling point or higher of the solvent to be vaporized.

Preferable heating temperature depends on the solvent. For example, the solution composition is pre-dried at a temperature of 100 to 200° C. for 10 minutes to 2 hours, and then is heated at a temperature of 200 to 350° C. for 10 minutes to 4 hours.

The support onto which the solution composition is applied may be a glass plate, a metal plate or the like. Examples of the metal include gold, silver, copper, aluminum and nickel. Preferably, a metal plate or foil such as copper foil is used as the support.

The thickness of the film is not limited. From the viewpoint of film production and mechanical characteristic of the film, the thickness is preferably 1-500 μm. From the viewpoint of handling, the thickness is more preferably 1-200 μm.

When a particularly high electric insulation property is required, the thickness of the film is preferably 200 μm or more. The surface of the film may be treated by abrading, physically or chemically with a chemical such as an acid or an oxidizing agent, or by irradiating with UV ray or plasma.

The film in the present invention is excellent in flexibility and dimensional stability, and is also difficult to curl up. Therefore, the film can be suitably used in a base film for laminate with copper plate, a film for a multi-layer print wiring board for semiconductor package and mother board (which may be obtained by a build-up method), a film for flexible print wiring board, a film for TAB (tape automated bonding), a film for tag tape, a film for a package for microwave oven, a film for shielding electromagnetic waves and the like.

Also, the film of the present invention can be suitably used in a high frequency printed wiring board, a probe cable, a communication equipment circuit, a substrate for package, since the film has good high frequency properties and low hygroscopic properties.

In the present invention, a laminate comprising the above-described film and a conductive layer is also provided. The laminate can be obtained, for example, by a method below. Before the lamination, the polyester film is preferably subjected to a surface treatment on a side for facing the conductive layer so that the adhesiveness between the film and the conductive layer is improved. Examples of the surface treatment include a corona discharge treatment, UV irradiation treatment and plasma treatment.

For example, the lamination can be carried out as follows:

(1) A method in which the liquid-crystalline polyester of the present invention is dissolved in a solvent to obtain a solution composition, from which fine foreign substances is removed by filtering through a filter or the like if necessary, and the solution composition is applied onto a metal foil by a roller coating method, a dip coating method, a spray coating method, a spinner coating method, a curtain coating method, a slot coating method, a screen printing method and the like, and removing the solvent to obtain a laminate of the film of the polyester and the metal foil.

(2) A method of affixing the above-mentioned film to a metal foil by heating and pressing the film on the metal foil.

(3) A method of affixing the above-mentioned film to a metal foil with an adhesive agent (4) A method of forming a metal layer by deposition on the above-mentioned film.

The method (1) is preferred since a laminate having a uniform film thickness and high adhesiveness between the film and the metal foil can be easily obtained.

The method (2) is also preferred since the pressuring of the film can be easily conducted using a press machine or a heating roller at (or around) a flow starting temperature of the film.

In the method (3), the adhesive agent is not limited. Examples of the adhesive include a hot melt adhesive, polyurethane adhesive and the like.

An ethylene copolymer can be employed as the preferable adhesive agent.

In the method (4), the method for deposition of the metal is not limited. Examples of the method include an ion beam sputtering, a high frequency sputtering, a direct current magnetron sputtering, and a glow discharge method.

Among them, the high frequency sputtering is preferred.

In the present invention, gold, silver, copper, nickel, aluminum and the like can be used as a metal for a conductive layer. Copper is preferable for a TAB tape and for a printed wiring board, and aluminum is preferable for a condenser.

The laminate may have multi-layer structure. For example, the laminate may have a two-layer structure having a film and a conductive layer; a three-layer structure in which conductive layers are placed on both sides of a film; or five-layer structure having in which films and conductive layers are alternately placed with one another.

The laminate may be, if necessary, subjected to a heat treatment to improve strength.

In the present invention, a flexible printed wiring board having the above-mentioned laminate is also provided. The printed wiring board can be produced by a method comprising the steps of providing a circuit using a photo-sensitive resist on the conductive layer of the laminate, conducting etching to dissolve and remove a partial of the conductive layer under an acid condition, removing the resist to form a conductive circuit, and affixing a cover film thereon. As the cover film, a film of the present invention can be used.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2006-029321 filed on Feb. 7, 2006 and Japanese Patent Application No. 2006-205875 filed on Jul. 28, 2006, both including specification, claims, drawings and summary, are incorporated herein by reference in their entirety.

EXAMPLE

The present invention is described in more detail by following Examples, which should not be construed as a limitation upon the scope of the present invention.

Example 1

A reaction vessel equipped with a stirring blade, a torque meter, a tube for introducing a nitrogen gas, a thermometer and a reflux condenser, was charged with 84.7 g (0.45 mol) of 2-hydroxy-6-naphthoicacid(hereinafter, referred to as "HNA"), 41.6 g (0.275 mol) of 4-hydroxyacetoanilide (hereinafter, referred to as "APAP"), 12.5 g (0.075 mol) of isophthalic acid (hereinafter, referred to as "IPA"), 51.7 g (0.2. mol) of diphenylether-4,4'-dicarboxylic acid (hereinafter, referred to as "DEDA") and 81.7 g (1.1 mol) of acetic anhydride. After sufficiently replacing the inside space of the reaction vessel with nitrogen gas, the mixture was heated up to 150° C. over 15 minutes under a stream of nitrogen gas, and refluxed for 3 hours keeping the temperature.

Then, the mixture was heated up to 320° C. over 170 minutes while distilling out vaporized acetic acid as a by-product and unreacted acetic anhydride. When an increase in torque was observed, the reaction was considered to be completed and the content of the vessel was discharged. The obtained solid substance was cooled to room temperature, crushed with a granulator, kept at 250° C. for 3 hours in a nitrogen atmosphere and subjected to polymerization reaction in the solid phase.

Example 2

Into a reaction vessel equipped with a stirrer, a torque meter, a nitrogen gas introducer, a thermometer and a reflux condenser were charged 75.3 g (0.40 mol) of HNA, 45.3 g (0.30 mol) of APAP, 13.3 g (0.08 mol) of IPA, 56.8 g (0.22 mol) of DEDA and 81.7 g (1.1 mol) of acetic anhydride. After sufficiently replacing the inside space of the reaction vessel with nitrogen gas, the mixture was heated up to 150° C. over 15 minutes under a stream of nitrogen gas, and refluxed for 3 hours keeping the temperature.

Then, the mixture was heated up to 320° C. over 170 minutes while distilling out vaporized acetic acid as a by-product and unreacted acetic anhydride. When an increase in torque was observed, the reaction was considered to be completed and the content of the vessel was discharged. The obtained solid substance was cooled to room temperature, crushed with a granulator, kept at 250° C. for 3 hours in a nitrogen atmosphere and subjected to polymerization reaction in the solid phase.

Reference Example 1

Into a reaction vessel equipped with a stirrer, a torque meter, a nitrogen gas introducer, a thermometer and a reflux condenser were charged 84.7 g (0.45 mol) of HNA, 41.6 g (0.275 mol) of APAP, 45.7 g (0.275 mol) of IPA and 81.7 g (1.1 mole) of acetic anhydride. After sufficiently replacing the inside space of the reaction vessel with nitrogen gas, the mixture was heated up to 150° C. over 15 minutes under a stream of nitrogen gas, and refluxed for 3 hours keeping the temperature.

Then, the mixture was heated up to 320° C. over 170 minutes while distilling out vaporized acetic acid as a by-product and unreacted acetic anhydride. When an increase in torque was observed, the reaction was considered to be completed and the content of the vessel was discharged. The obtained solid substance was cooled to room temperature, crushed with a granulator, kept at 250° C. for 3 hours in a nitrogen atmosphere and subjected to polymerization reaction in the solid phase.

Reference Example 2

Into a reaction vessel equipped with a stirrer, a torque meter, a nitrogen gas introducer, a thermometer and a reflux condenser were charged 75.3 g (0.40 mol) of HNA, 45.3 g (0.30 mol) of APAP, 13.3 g (0.30 mol) of IPA and 81.7 g (1.1 mole) of acetic anhydride. After sufficiently replacing the inside space of the reaction vessel with nitrogen gas, the mixture was heated up to 150° C. over 15 minutes under a stream of nitrogen gas, and refluxed for 3 hours keeping the temperature.

Then, the mixture was heated up to 320° C. over 170 minutes while distilling out vaporized acetic acid as a by-product and unreacted acetic anhydride. When an increase in torque was observed, the reaction was considered to be completed and the content of the vessel was discharged. The obtained solid substance was cooled to room temperature, crushed with a granulator, kept at 250° C. for 3 hours in a nitrogen atmosphere and subjected to polymerization reaction in the solid phase.

Example 3

To 920 g of N-methyl-2-pyrolidone, was added 80 g of the powdery liquid-crystalline polyester obtained in Example 1. The mixture was heated to 160° C. so that the polyester was completely dissolved to obtain a clear, brown liquid-crystalline polyester solution composition. The solution composition was applied (cast) onto an electrodeposited copper foil (3EC-VLP; 18 μm; manufactured by Mitsui Mining & Smelting Co., Ltd.) with a film applicator. The resulting copper foil with the composition was heated at a temperature of 120° C. with a high temperature hot-air dryer to remove the solvent in the composition, and then was subjected to a heating treatment at a temperature of 300° C. to obtain a laminate of a film and a conductive layer. After etching the laminate entirely, a film having a thickness of 25 μm was obtained.

Example 4

To 920 g of N-methyl-2-pyrolidone, was added 80 g of the powdery liquid-crystalline polyester obtained in Example 2. The mixture was heated to 160°0 C. so that the polyester was completely dissolved to obtain a clear, brown liquid-crystalline polyester solution composition. The solution composition was applied onto an electrodeposited copper foil (3EC-VLP; 18 μm; manufactured by Mitsui Mining & Smelting Co., Ltd.) with a film applicator. The resulting copper foil with the solution composition was heated at a temperature of 120° C. with a high temperature hot-air dryer to remove the solvent in the solution composition, and then was subjected to a heating treatment at a temperature of 300° C. to obtain a laminate of a film and a conductive layer. After etching the laminate entirely, a film having a thickness of 25 μm was obtained.

Comparative Example 1

To 920 g of N-methyl-2-pyrolidone, was added 80 g of the powdery liquid-crystalline polyester obtained in Reference Example 1. The mixture was heated to 160° C. so that the polyester was completely dissolved to obtain a clear, brown liquid-crystalline polyester solution composition. The solution composition was applied onto an electrodeposited copper foil (3EC-VLP; 18 μm; manufactured by Mitsui Mining & Smelting Co., Ltd.) with a film applicator. The resulting copper foil with the solution composition was heated at a temperature of 120° C. with a high temperature hot-air dryer to remove the solvent in the solution composition, and then was subjected to a heating treatment at a temperature of 300° C. to a laminate of a film and a conductive layer. After etching the laminate entirely, a film having a thickness of 25 μm was obtained.

Comparative Example 2

To 920 g of N-methyl-2-pyrolidone, was added 80 g of the powdery liquid-crystalline polyester obtained in Reference Example 2. The mixture was heated to 160° C. so that the polyester was completely dissolved to obtain a clear, brown liquid-crystalline polyester solution composition. The solution composition was applied onto an electrodeposited copper foil (3EC-VLP; 18 μm; manufactured by Mitsui Mining & Smelting Co., Ltd.) with a film applicator. The resulting copper foil with the solution composition was heated at a temperature of 120° C. with a high temperature hot-air dryer to remove the solvent in the solution composition, and then was subjected to a heating treatment at a temperature of 300° C. to a laminate of a film and a conductive layer. After etching the laminate entirely, a film having a thickness of 25 μm was obtained.

The laminates obtained in Examples 3 and 4 and in Comparative Examples 1 and 2 were evaluated respectively in terms of "Curl Degree", "Flexibility" and "Linear thermal expansion coefficient". The evaluation results are shown in Table 1.

Each value in the evaluation was measured by the methods below.

Curl Degree:

The laminate to be measured was annealed at a temperature of 300° C. for 1 hour. From the annealed laminate, a piece of laminate (150 mm×150 mm) was cut off. The cut piece was placed on a flat platen so that the side of a conductive layer (copper foil) faces the platen. After that, the distance (unit: mm) between both ends of the conductive layer was measured.

In the case when the laminate did not curl so much and distance D was able to be measured (see, FIG. 1), then Curl Degree was calculated by equation below:

$$\text{Curl Degree} = (105 - D)/150$$

In such a case, Curl Degree is in the range of from 0 to 1.

Figure 2:
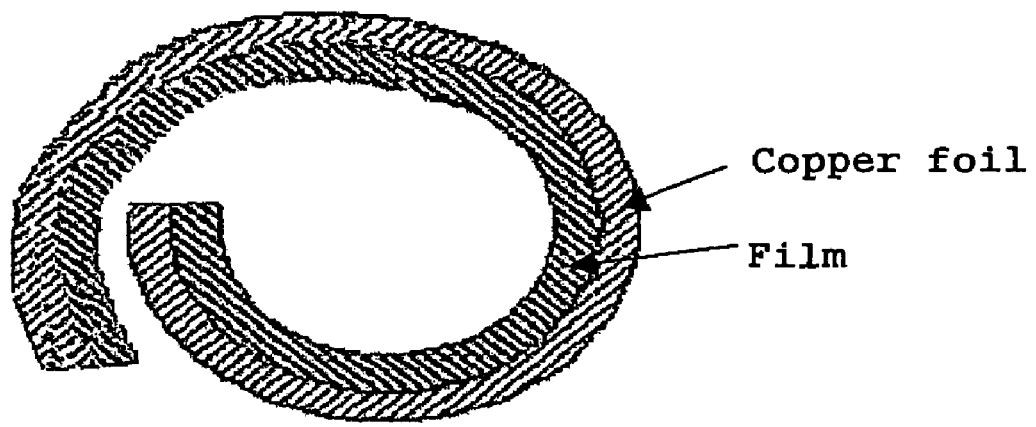
FIG. 2. is a view showing a frame format of a laminate having Curl Degree of larger than 1.

In the case when the laminate curled so much and distance D was not able to be measured (see, FIG. 2), Curl Degree was regarded to be "larger than 1".

Smaller Curl Degree means that the laminate is difficult to curl, desirably.

Linear Thermal Expansion Coefficient:

Using a thermo-mechanical analysis device TMA (manufactured by Seiko Instruments Co., Ltd.), a linear thermal expansion coefficient of film in the range of 50-100° C. was measured in a nitrogen gas stream while raising a temperature at a rate of 5° C./min.

The direction of pulling the film was regarded as "MD", while the direction perpendicular to the MD was regarded as "TD". Linear thermal expansion coefficients in both directions were measured.

Flexibility:

Using MIT bending tester (following JIS-P8815 method) manufactured by Toyo Seiki Manufacturing Co., Ltd., bending test was conducted at a bending angle of 135° (R=0.38), and the number of times of bending (until the film was broken) was counted.

TABLE 1

|  | Example 3 | Example 4 | Comparative Example 1 | Comparative Example 2 |
|---|---|---|---|---|
| Curl Degree | 0.17 | 0.20 | Larger than 1 | Larger than 1 |
| Flexibility (Number of times of bending) | 124,000 | 135,000 | 67,000 | 75,000 |
| Linear thermal expansion coefficient (×10⁻⁶/° C.) | | | | |
| Direction (MD) | 22 | 23 | 40 | 42 |
| Direction (TD) | 22 | 23 | 41 | 42 |

What is claimed is:

1. A liquid-crystalline polyester obtainable by polymerizing monomers (1) to (4) which derive structural units represented by formulas (i) to (iv) respectively below:

—O—Ar1-CO—, (i)

—NH—Ar2-X—, (ii)

—CO—Ar3-CO— and (iii)

—CO—Ar4-Z-Ar5-CO—, (iv)

wherein Ar1 represents 1,4-phenylene, 2,6-naphtylene or 4,4'-biphenylene, Ar2 represents 1,4-phenylene or 1,3-phenylene, X represents —O— or —NH—, Ar3 represents 1,4-phenylene, 1,3-phenylene or 2,6-naphthylene, Ar4 and Ar5 independently represent 1,4-phenylene, 2,6-naphthylene or 4,4'-biphenylene, and Z represents —O—, —SO$_2$— or —CO—, in which the amount of monomer (1) is 30-80% by mol, the amount of monomer (2) is 10-35% by mol, the total amount of monomers (3) and (4) is 10-35% by mol and the amount of monomer (4) is 1% by mol or larger, the amounts of which are all on the molar basis of the total amount of monomers (1) to (4).

2. The liquid-crystalline polyester according to claim 1, wherein Ar1 represents 2,6-naphthylene, Ar2 represents 1,4-phenylene, X represents —O—, Ar3 represents 1,3-phenylene, Ar4 and Ar5 both represent 1,4-phenylene and Z represents —O—.

3. A film containing the liquid-crystalline polyester according to claim 1.

4. A solution composition comprising the liquid-crystalline polyester according to claim 1 and a solvent.

5. The solution composition according to claim 4, wherein the solvent is an aprotic solvent.

6. The solution composition according to claim 4, wherein the solvent is an aprotic solvent, and 0.01 to 100 parts by weight of the liquid-crystalline polyester is contained per 100 parts by weight of the aprotic solvent.

7. The solution composition according to claim 5, wherein the aprotic solvent is an aprotic solvent having no halogen atom.

8. The solution composition according to claim 5, wherein the aprotic solvent is an aprotic solvent having a dipole moment of from 3 to 5.

9. A method for producing a film, the method comprising the steps of applying the solution composition according to claim 4 on a support, removing the solvent in the solution composition, heating the resulting support and removing the support.

10. A laminate comprising a film according to claim 3 and a conductive layer.

11. A flexible printed wiring board having the laminate according to claim 10.

* * * * *